US006349398B1

(12) United States Patent
Resnick (10) Patent No.: US 6,349,398 B1
(45) Date of Patent: Feb. 19, 2002

(54) METHOD AND APPARATUS FOR PARTIAL-SCAN BUILT-IN SELF TEST LOGIC

(75) Inventor: David Resnick, Eau Claire, WI (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/237,486

(22) Filed: Jan. 26, 1999

(51) Int. Cl.[7] ............................................. G01R 31/28
(52) U.S. Cl. ........................................ 714/733; 714/724
(58) Field of Search ................................. 714/712, 724, 714/727, 43, 733; 348/706

(56) References Cited

U.S. PATENT DOCUMENTS

| 4,357,703 A | | 11/1982 | Van Brunt ................... 714/733 |
| 4,380,070 A | * | 4/1983 | Steiner ........................ 714/712 |
| 4,701,920 A | | 10/1987 | Resnick et al. .............. 714/733 |
| 5,130,645 A | * | 7/1992 | Levy ............................. 714/724 |
| 5,281,864 A | | 1/1994 | Hahn et al. ............... 307/272.2 |
| 5,355,369 A | | 10/1994 | Greenberger et al. ....... 714/727 |
| 5,781,250 A | * | 7/1998 | Jun ............................. 348/706 |
| 5,862,152 A | * | 1/1999 | Handly et al. .............. 714/727 |
| 6,018,810 A | * | 1/2000 | Olarig ........................... 714/43 |

OTHER PUBLICATIONS

"The ABCs of Boundary–Scan Test", *John Fluke Mfg. Co. Inc.*, pp. 1–43, (1991).

* cited by examiner

Primary Examiner—David Ton
(74) Attorney, Agent, or Firm—Schwegman, Lundberg, Woessner & Kluth, P.A.

(57) ABSTRACT

An integrated circuit apparatus includes main logic for performing digital logic operations. The main logic is further comprised of a plurality of logic modules, each having at least one logic block associated with the logic module. Many times several logic blocks are associated with the logic modules. The main logic further also includes a number of input pins for receiving data and a number of output pins for outputting data from the main logic. Also included on the integrated circuit apparatus is testing logic for performing dynamic tests of the main logic. The testing logic further includes a first type of built-in testing logic for testing a first number of the logic modules of the main logic and a second type of built-in test logic for testing a second number of logic blocks. The second number of logic blocks connected to the second type of built-in scan logic are generally untestable using the first type of built-in logic. The second type of testing logic includes a test data input for inputting test data to the second type of testing logic and to the input pins of the main logic, and a test data output for outputting test data from the second type of testing logic and from the main logic. The second type of built-in scan logic Includes an internal scan ring. The testing logic also includes a command register for receiving commands and outputting control signals to control the main logic and the testing logic.

34 Claims, 7 Drawing Sheets

METHOD AND APPARATUS FOR PARTIAL-SCAN BUILT-IN SELF TEST LOGIC

FIELD OF THE INVENTION

The present invention relates generally to an apparatus and method for testing logic on circuit chips. In particular, the present invention relates to structure and function of the test logic within the main logic of a chip for partial-scan built-in self-test on a circuit chip.

BACKGROUND OF THE INVENTION

The number of devices, also called transistors, on a commonly available integrated circuit may be very large. Very Large Scale Integrated ("VLSI") circuits with 15 million devices have been developed. The present trend in integrated circuit design is toward even higher levels of circuit integration, thereby reducing costs and improving circuit reliability. As IC technologies continue to develop, it is expected that circuits with at least 100,000,000 devices will become common.

Increased circuit integration is not, however, obtained without drawbacks. Increasing chip testing costs tend to reduce the benefits derived from more economically efficient design and production techniques. Typically, the costs associated with integrated circuit chip testing increases more than the increase in the number of devices thereon. Large expenses are incurred in the development of computer programs for running test routines. The engineering effort and computer time needed to devise these test routines may even exceed the requirements for designing the chip itself. It is not uncommon to employ as many engineers to develop tests for an IC to assure the quality of the part as the number of engineers designing a part.

Depending upon the particular type of circuit involved, circuit chip testing costs can now account for roughly 10 to 40 percent of the total manufacturing costs. The most commonly used technique of IC testing is known as scan design. Scan design requires the circuit designer to break complex logic circuits into smaller blocks, and to include artificial pathways into and between the blocks for data transmission. Complex sequential circuitry is thereby temporarily converted to combinational circuitry for testing purposes.

Scan design techniques are far from optimal. Scan design does not, in general, permit faults to be isolated to a particular chip or wire net. The inclusion of additional test points and transmission paths required for scan design degrades overall IC performance. Scan design also requires additional clock circuitry and relatively complicated maintenance software.

Another testing technique, one that is becoming increasingly popular, is the built-in self-test technique. As its name implies, built-in self-test, or BIST, test systems are fabricated on the IC chip to be tested. BIST systems include a pattern or operand generator for producing test operands. Each test operand is applied to the IC logic, and the response thereto analyzed by means of a shift register. The response to thousands, and even millions, of test operands is then compressed into a "signature", which is compared to predetermined signatures for a go/no go indication of the IC's operation. One such BIST system is disclosed in the Van Brunt U.S. Pat. No. 4,357,703.

The BIST approach to circuit testing offers numerous advantages. BIST has minimal impact upon main logic functions since it is typically fabricated on the sparsely used peripheral areas of the integrated circuit chip. Since test results are processed by the BIST system, the number of tasks which must be performed by external test equipment is reduced. Specially developed maintenance software is therefore greatly reduced. Dynamic testing at full system clock rates significantly reduces system test times. BIST systems can also be used for testing integrated circuits at the wafer, chip, and system levels. Since they are independent of specific chip logic functions, BIST test systems can be used on any number of different types of circuit chips. The BIST approach also permits IC chips to be tested after they have been assembled into a computer, even though they are inaccessible to more traditional maintenance techniques. This will be the case, for example, when the IC is immersed in a liquid coolant to increase its performance.

Even though BIST test systems offer many advantages over alternative techniques, BIST test systems have yet to be developed to their fall potential. BIST testing systems have significant shortcomings when used in integrated circuits having 100,000 or more devices. BIST systems usually generate random numbers as test operands. The quality of many of the test operands, in terms of stressing the part, may be poor. When an integrated circuit has a high number of devices or transistors and as the operand goes deeper and deeper into the logic on the integrated circuit, the test becomes less and less effective. If there is a defect in the integrated circuit at a latch in the middle of the integrated circuit, there is a distinct possibility that the defect may go undetected. Certain areas of the integrated circuit may be untestable in that a defect may not propagate through many layers of logic and to an output pin to cause a test result indicating a defect. The result is that the integrated circuit may test "good" when it is really a defective part that should be scrapped.

As a result, there is need for a method and apparatus for determining if a logic module may have a portion that is untestable. Furthermore, there is a need for a flexible self-testing method and apparatus that is adaptable and can be used to sensitize certain paths on an integrated circuit so that the fault that might otherwise go unnoticed is output to the output pins. There is also a need for developing a testing method and apparatus that can be used by the logic designer or logician to add logic during the design phase to sensitize paths to untestable areas. There is also a need for developing a testing method and apparatus that can be used by the logic designer or logician to add logic during the design phase to make a logic block more testable. There is also a need for a flexible method and apparatus which can be used to control the test as well as the type of test that to be executed. Furthermore, there is a need for a method and apparatus that tests the integrated circuit to the extent necessary to determine if the part is good or bad. Furthermore, it would be advantageous if the testing method also could interface with a boundary scan type test, such as JTAG. JTAG is a boundary scan standard, found at IEEE/ANSI 1149.1-1990, which is a collection of design rules applied principally at the integrated circuit level. It would also be advantageous if the power to the logic used for testing the integrated circuit could be powered down when the integrated circuit is not under test to save power and reduce the overall cooling load on the computer. This would lower the amount of energy used and reduce the costs associated with operating the computer.

SUMMARY OF THE INVENTION

A digital integrated circuit apparatus includes main logic for performing logic operations. The main logic is further comprised of a plurality of logic modules, each having at least one logic block associated with the logic module. Many times several logic blocks are associated with the logic modules. A logic module is an internal logic block of an IC under test. The main logic further also includes a number of input pins for receiving data and a number of output pins for outputting data from the main logic. Also included on the integrated circuit apparatus is testing logic for performing dynamic tests of the main logic. The testing logic further includes a first type of built-in testing logic for testing a first number of the logic modules of the main logic and a second type of built-in test logic for testing a second number of logic blocks. The first type of built-in testing logic could be logic known as BIST. The second number of logic blocks connected to the second type of built-in scan logic are generally untestable using the first type of built-in logic. The second type of testing logic includes a test data input for inputting test data to the second type of testing logic and to the input pins of the main logic, and a test data output for outputting test data from the second type of testing logic and from the main logic. The second type of built-in scan logic includes an internal scan ring.

The testing logic also includes a command register for receiving commands and outputting control signals to control the main logic and the testing logic. The control signals output from the command register included generation of data, and shifting of data. One of the commands is for substantially powering down the testing logic on the logic chip when the logic chip is not under test.

Advantageously, the invention includes a method and apparatus for determining if a logic module may have a portion that is untestable and a method and apparatus for testing the untestable portions. The invention also provides a method and apparatus that can be used by the logic designer or logician to add logic during the design phase to sensitize paths to untestable areas. The invention provides a flexible self-testing method and apparatus that is adaptable and can be used to sensitize certain paths on an integrated circuit so that faults that might otherwise go unnoticed are output to the output pins. The command register of the invention also provides for flexible control of the test as well as flexibility in the types of test to be executed. An additional advantage of the testing method is that it can also could do boundary scan type testing, much like the JTAG standard, found at IEEE/ANSI 1149.1-1990. The command register can also power down the logic used for testing the integrated circuit when the integrated circuit is not under test. This saves power and reduces the overall cooling load on the computer.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
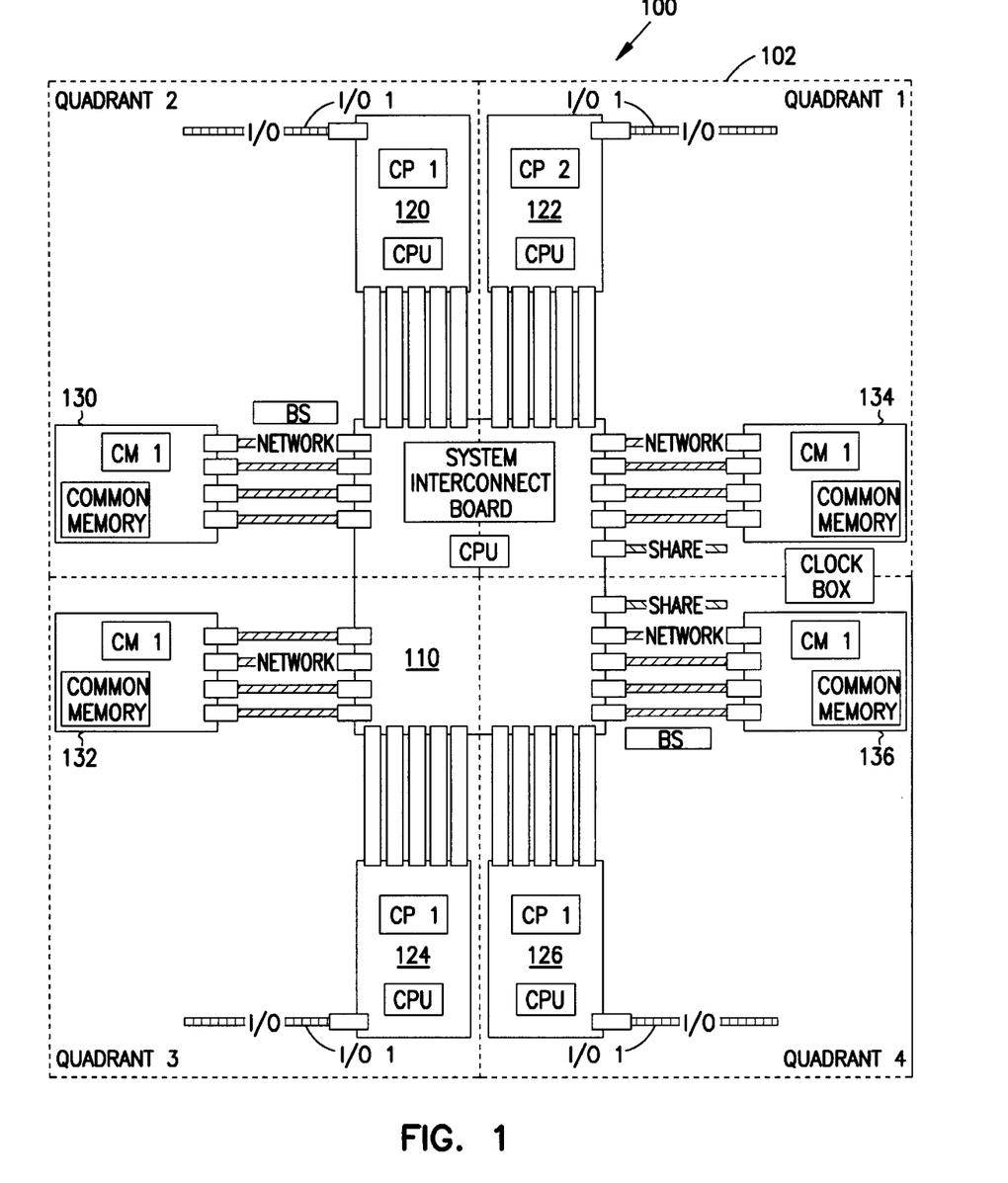
FIG. 1 is a schematic diagram of a supercomputer showing the large number of boards, which are populated with numerous modules which include integrated circuits contained in a supercomputer.

Referring to FIG. 1, a supercomputer 100 is shown. The supercomputer 100 includes a housing 102 which is depicted by dotted lines. The supercomputer includes a system interconnect board 110. CPU boards 120, 122, 124 and 126 are actual hardware printed circuit boards attached to the system interconnect board 110. Common memory boards 130, 132, 134, and 136 are also hardware printed circuit boards attached to the system interconnect board 110. Each of the CPU boards 120, 122, 124 and 126 shown in FIG. 1 is actually a stack of eight boards. As can be seen, there are many boards that must undergo testing. If any one of the boards is bad, the supercomputer 100 is bad. It is advantageous to have a self-testing capability in the case of any computer and extremely advantageous in a supercomputer 100 since there are a large number of boards to test. If the testing had to be done by hand or hook up of external circuitry, testing a supercomputer would be cumbersome and possibly impossible. In addition, a supercomputer 100 also has a large number of boards 120, 122, 124, 126, 130, 132, 134, and 136 which require a relatively large amount of power to operate. Each of the boards 120, 122, 124, 126, 130, 132, 134, and 136 may include a number of integrated circuits. The boards and integrated circuits also include a multiplicity of logic modules. Since there are so many boards and logic modules involved, even a small savings of resources at the board or module level would be significant.

Figure 2:
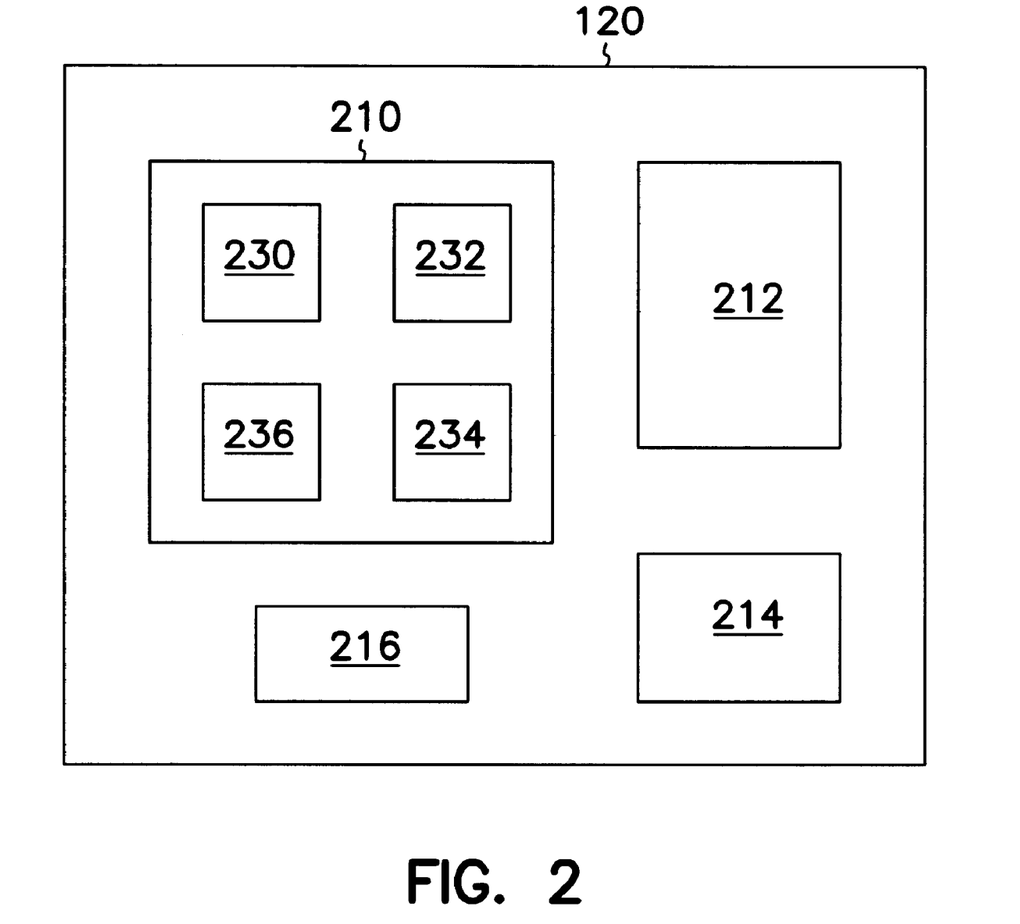
FIG. 2 is a schematic diagram of a module showing chips and logic blocks within the module.

FIG. 2 shows one hardware printed circuit board 200. The printed circuit board 200 includes chips 210, 212, 214, and 216. Each of the chips includes one or more logic blocks or logic modules. For all practical purposes, each chip includes a plurality of logic blocks or modules. A logic module is an internal logic block of an integrated circuit. The logic module is a portion of all the logic associated with an IC or integrated circuit. A logic module is typically an internal logic block of an IC being tested. In FIG. 2, chip 210 is the only one illustrated with logic blocks. Chip 210 includes logic blocks 230,232, 234, and 236.

Figure 3:
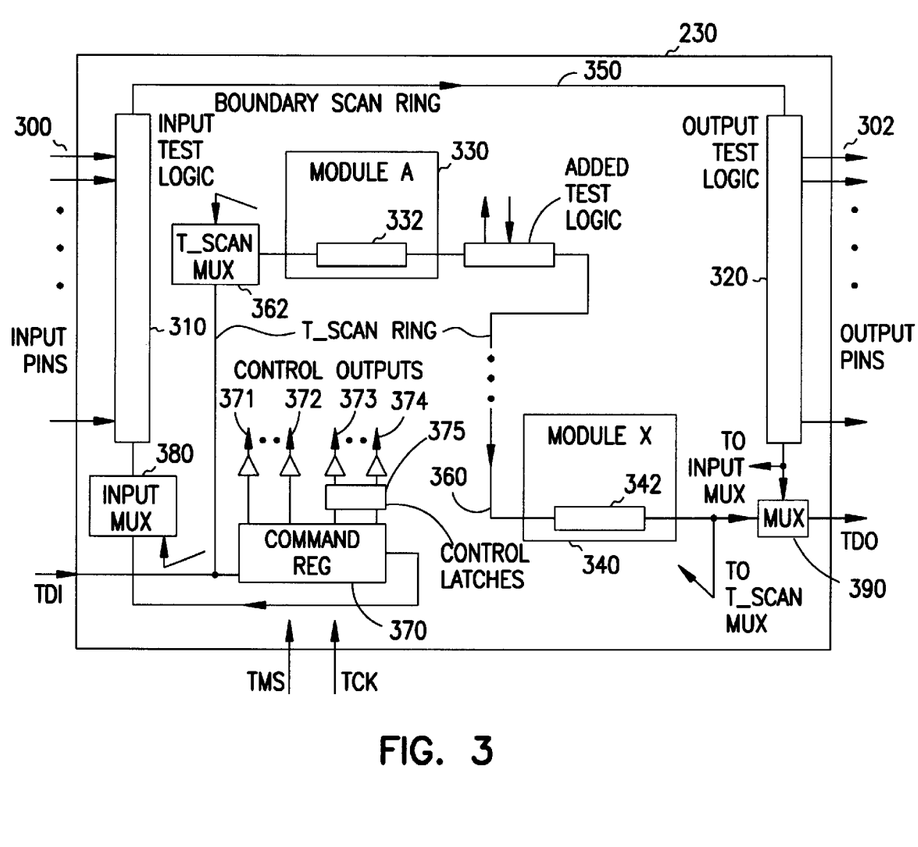
FIG. 3 is a block diagram showing several components electrically connected to one another in accordance with this invention.

FIG. 3 is a schematic diagram showing one chip 230. The chip 230 includes a grouping of logic modules, such as logic module A and logic module X. It should be understood, that the logic modules discussed with respect to FIG. 3 may bear no real relation to the hardware shown in FIG. 2. The hardware shown in FIG. 2 is used to implement the logic in the logic blocks and logic modules. Chips can be thought of as merely a grouping of logic modules. The logic modules themselves are groupings of logic that make sense to a logic designer or logician. For example, logic module A (reference number 330) shown in FIG. 3 may be the logic for performing a certain function, such as a vector pipeline. Logic module X (reference number 340) is the logic associated with another function. The chip 230 of FIG. 3 includes the self-testing logic in accordance with this invention. Each logic block includes main or core logic, and testing logic.

The main or core logic typically includes tens or even hundreds of thousands of electronic devices such as transistors or FETs, and occupies a major portion of the surface area of the integrated circuit chip. The main or core logic is the logic that is applied to data by the computer or information handling system. The testing logic is logic that is used when a self-test is performed on the particular board or the particular integrated circuit chip. Part of the self-test function is to load test data into the main logic of the chip. The testing logic occupies a minor portion of the surface area of the integrated circuit chip.

FIG. 3 illustrates, for the most part, the testing logic, although the main or core logic is partly shown in FIG. 3. For example, each logic module 330 and 340 is represented by a bound box. Some of the main or core logic is within the logic module 330 and 340. Also shown within the bound box of logic module 330 is a smaller box which is the internal test logic 332. Similarly, a smaller box representing the internal test logic 342 for logic module 340 is also shown.

Figure 5:
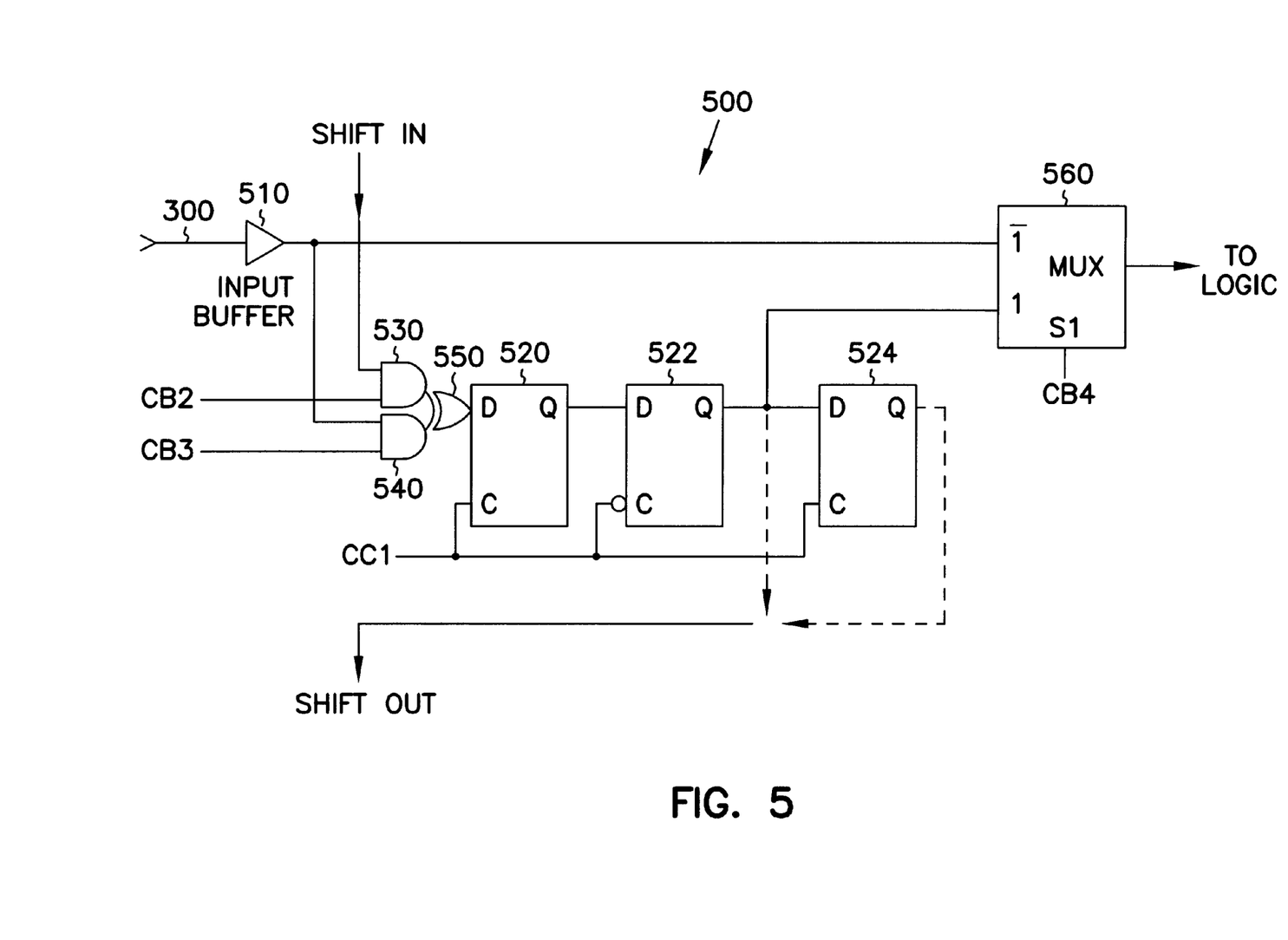
FIG. 5 is a schematic diagram showing the input cell of this invention.
Figure 6:
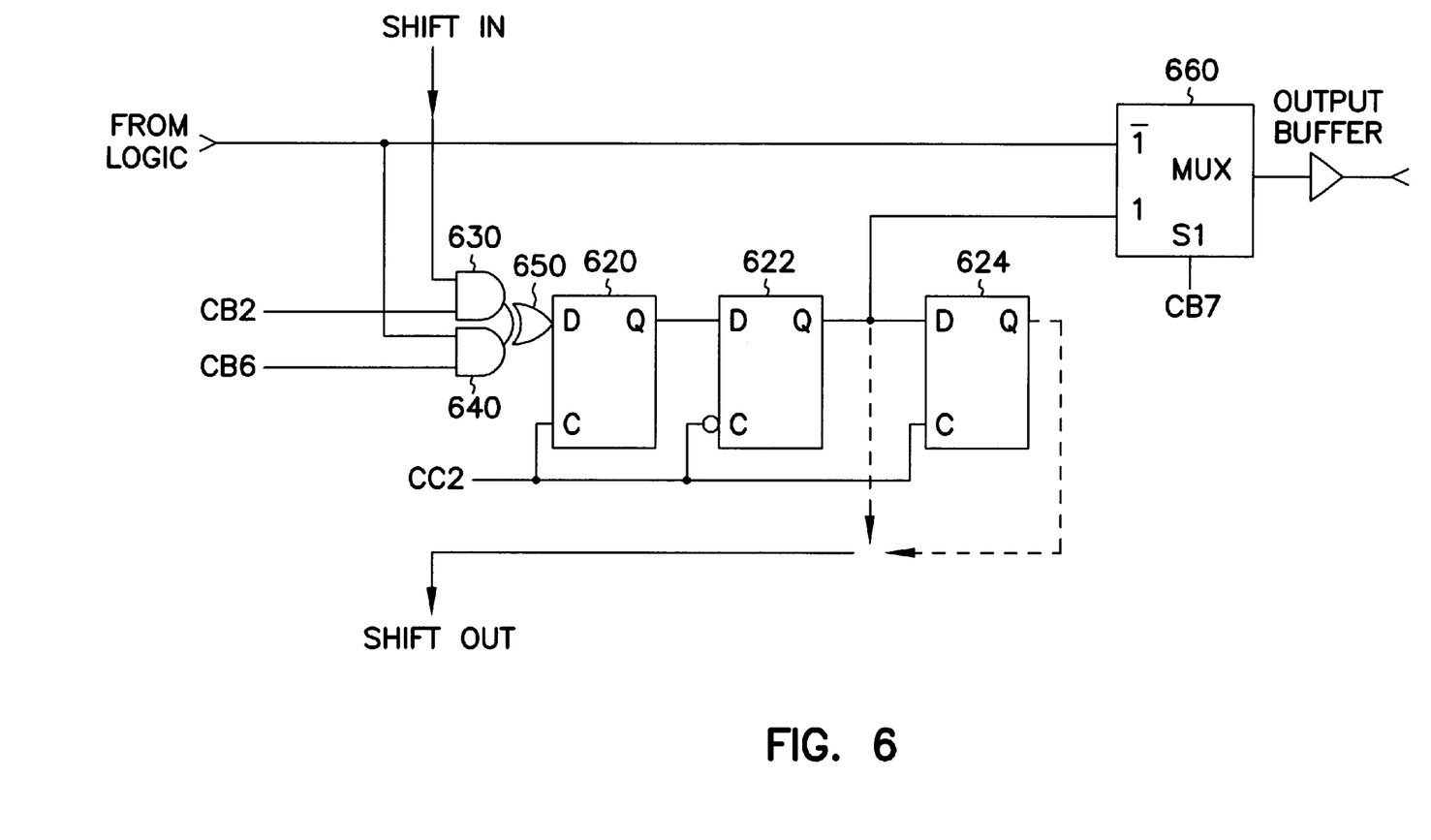
FIG. 6 is a schematic diagram showing the output cell of this invention.

As shown in FIG. 3, the board 120 includes input pins 300 and output pins 302. Data is input to the input pins 300 when the board 120 is not in test mode. The input pins 300 are electrically connected to the input test logic 310. The input test logic includes a plurality of input cells, one of which is shown in FIG. 5. The input test logic 310 is invisible to data brought in on the input pins 300 when the chip 230 is in normal operation. The logic module captures boundary scan or other test operands coming in from the chip's input pins 300 and has several other functions which will be discussed with respect to FIGS. 4–7. The chip also includes output test logic 320 which includes a plurality of output cells, one of which is shown in FIG. 6. The output cells and the output test logic 320 are also invisible when the chip 230 is in normal operation. The output test logic 320 and the individual output cells in that test logic also must generate boundary scan or other test operands being driven from a chip's output pins for when parametric or module level tests are run. Boundary scan includes input logic (310) and output logic (320). This logic has its functionality expanded (above boundary scan) to support the other test functions.

The chip 230 also includes an external boundary scan ring 350. The external boundary scan ring 350 is attached at one end to the input test logic 310 and the input pins 300, and attached at the other end to the output test logic 320 and the output pins 302. The chip 230 also has an internal scan ring or T_Scan ring 360. The internal scan ring 360 is connected to portions of the main logic which are not otherwise testable by a separate self-testing algorithm. The internal scan ring 360 is a serial chain to all of the portions or blocks of logic that need to be tested that are otherwise untestable using a self-test such as BIST. Generally, when BIST is run on the logic of a part, at deeper layers of logic, many times a fault will not be seen or output in response to running a first self-testing algorithm, such as BIST. The logician or logic designer determines which portions of logic are not testable using a first type of self-test and then attaches all the portions of logic that are not testable such as logic block 332 and logic block 342, in a serial fashion on an internal scan ring 360. The internal scan ring 360 sensitizes controls and observes the path to the untestable logic on the chip 230. The untestable logic in module 330 is depicted as logic block 332 and the untestable logic in logic module 340 is logic block 342. These logic blocks are part of a serial chain to all the blocks that need tests.

At the time that the logic blocks are designed by the logic designer or logician, a software package can be used to test a logic module, such as 330. The logician determines which of the portions of the logic module 330 are untestable using a first type of self-test, such as BIST. In some cases, logic is added to control some of the main or core logic so that faults can be observed using the first type of self-testing logic, such as BIST. In other cases, even if additional test logic is put on the part, certain blocks of logic, such as 332, cannot be adequately tested using the first type of internal or self-testing logic. The blocks such as 332, which cannot be tested using a first type of self-testing logic, are then attached serially to the internal scan chain 360. Attaching the untestable logic blocks 332 and 342 to the internal scan chain 360 sensitizes the path on the part so that a fault that occurs within the logic blocks 330 or 340 would be observable at the output pins or represented in the test data out signal.

The chip 230 also includes a command register 370. Various commands can be loaded into the command register including powering up the test logic when a test logic bit is enabled and performing a boundary scan test and the shifting of data at various portions of the test logic. The command register 370 has control outputs 371, 372, 373 and 374. Some of the outputs, such as 373 and 374, are latched by a control latch 375. The outputs 371, 372, 373 and 374 control the test logic. The control outputs 371, 372, 373 and 374 control the external boundary scan test on the external boundary scan ring 350 as well as the first type of internal self-test, such as BIST, as well as control the logic on the internal scan ring 360.

The chip 230 also has a test data input ("TDI"), a test master signal ("TMS") and a test clock ("TCK"). The test data input signal is input to the command register 370 as well as to the internal scan ring 360. The test data input is placed on the input pins 300 by the command register 360 by controlling the input pin test logic in the input test logic 310. An input MUX 380 is used after the first loading of test data or the initialization of the input pins 300. The input MUX has the test data in as one input and the output of the output test logic 320 as another input. The output from the output test logic 320 is used or is fed into the input MUX 380 to randomize the test data input as well as to keep any failure observed at the output pins 302 within the part. It should be understood that the self-test runs on a set of randomized numbers that are produced in successive clock cycles. In other words, the operand or test data in value is randomized during the self-test mode. Rather than add a random number generator to the chip 230, a pseudorandom generator is produced by inputting the test data in and the output of the test logic 320 at the MUX 380. Similarly, the internal scan ring includes a MUX 362 which has as one of its inputs the test data in, and as another of its inputs, the output from the end of the internal scan ring 360. By inputting the output of the scan ring to the MUX 362, a pseudorandomizer of data is generated and in addition any failure that is produced in the internal scan ring 360 is kept on the part throughout the test which can be thousands of clock cycles long. The output of the output test logic 320 and the output of the internal scan ring 360 are both input to a multiplexer or MUX 390 to produce the test data output ("TDO"). The test data output is then checksummed to determine if the chip 230 and the main or core logic thereon is good.

The advantage of the test logic implementation shown in FIG. 3 in which there is an external boundary scan ring 350, an internal scan ring 360, as well as a first type of internal self-testing, is that all of the logic or core logic on the chip 230 can be adequately tested. Use of the internal scan ring 360 assures that portions of the logic or logic block, such as 332 and 342, which would not be testable by a first type of internal self-testing, such as BIST, can also be tested. The amount of test logic used is just enough to allow for adequate testing of the part. This minimizes the overhead on the part that is devoted to test logic. It is said that this is a partial-scan type of self-test. Use of the internal scan ring 360 assures that the untested portions when a fault results in an untestable logic block 332 and 342, that the fault will be observed at the output pins or in the test data out signal. An additional advantage is that a command register is placed on board the chip 230. This allows for control outputs that are used to control the test logic on board the chip 230. In addition, the command register has a number of inputs which allows for flexibility in the type of command that can be input to the command register.

The command register 370 also allows the flexibility of sending in commands to the command register that allow for both internal self-testing as well as external scan testing between the parts. The internal self-testing can be used to test the main or core logic within the part. The external scan test can be used to check the connections between the output pins and input pins of the chip 230 and the actual board upon which it sits. The internal self-testing and external scan test are done at different times. In addition, since this is a partial-scan type of test, the overhead associated with it is relatively inexpensive. In other words, the amount of test logic used is just enough to provide for adequate testing of the part or chip 230 and, therefore, the amount of test logic that must be added to the chip is minimized. Since the amount of test logic is minimized, the amount of "overhead" is also minimized in that less testing logic has to be incorporated per chip. An additional advantage is that one of the bits in the command register 370 controls the powering up or powering down of substantially all the test logic on board the chip 230. This also reduces the operating overhead on the chip. For example, main or core logic on such a chip may dissipate 70 watts while the testing logic may use 10 watts of power. In previous designs, the test logic was always powered on and, therefore, the extra heat dissipation had to be dealt with in terms of cooling the part.

The Command Register

The test control/command register 370 is a serial chain of 18 bits. Each bit controls one specific function associated with chip testing so that no decoding is needed. Some of the bits are used directly from the register while some other bits are forced into another flip-flop that then drives a fanout. As a result, some functions can remain valid even while data is changing in the control register. Bit 0 of the register is the bit immediately against the TDI pin.

A test is performed by loading the control register, with TMS inactive, and then activating TMS. On the next TCK*Clk edge the control latches and fanouts are driven with the new data. The 'Clk' is the main system/chip clock signal.

The control register bits are:

| Bit # | Latch | Function |
| --- | --- | --- |
| 0 | Y | Power-up all test logic when active.[1] Don't have to load the whole control register to change this state. |
| 1 | — | Boundary Scan Test if active. Gives compatibility with previous design. |
| 2 | — | Enable shift data into all Boundary Scan ("BS") Flip-Flops ("FFs") (Input, Output, Bidirectional) when active. |
| 3 | — | Enable input pin data into BS FFs [Exclusive-OR ("XOR") data if both 2 and 3 active]. |
| 4 | — | Enable input pin data to chip logic if inactive; enable BS test data to logic if active/BIST. |
| 5 | — | Enable clock to Input BS register when TMS active. |
| 6 | — | Enable logic data to Output BS FFs (XOR data if 2 and 6 both active). |
| 7 | — | Enable chip data to output pins if inactive; enable Output BS test data to output pins if active. |
| 8 | — | Enable clock to Output BS register when TMS active. |
| 9 | — | Enable clock to Bidirectional BS register when TMS active. |
| 10 | — | Enable shift of T_Scan internal register when inactive; enable test function of T_Scan when active. |
| 11 | — | Enable clock to T_Scan internal register when TMS active. |
| 12 | — | Enable test data to ICM logic if active, otherwise allow normal data. |
| 13 | — | Force 'even' Bidirectional outputs on when active.[2] |
| 14 | — | Force 'odd' Bidirectional outputs on when active.[2] |
| 15 | Y | IZZ | Master Clear when active. The control command that starts a test will (presumably) turn this off, if used. |
| 16 | Y | IZU | Test Mode if active. Use is up to logic designers. |
| 17 | — | IZV | Enable test initialization. Use is up to logic designers. Typically used with IZZ and IZU as required. |

[1]The driver flip-flop should power-up in a clear (off) state if at all possible.
[2]Master clear of the chip must turn off/disable all bidirectional outputs if these functions are present.

In addition to the invention, there are two force bits (bits 12 and 13) of bidirectional pins because the input and output logic levels of those pins are not compatible with the other pin's levels. This means that, on chip, only those pins can be jumpered to one another for testing.

There are three functions that control data paths within the test logic. These functions are associated with the input multiplexer 380 and output multiplexer 390 in the TDI and TDO paths. The input MUX 380 is controlled by the TMS signal. If TMS is inactive, the output of the control register is connected to the first bit of the boundary scan register. If TMS is active, the last bit of the bit shift ("BS") output register is connected to the first bit of the BS input register.

The output MUX 390 is controlled by bits 10 and 2 of the control register. If bit 10 is cleared and bit 2 is set and active (i.e., TMS is enabled), the T_Scan output is connected to TDO. Otherwise, the last boundary scan output bit is connected to TDO.

The internal scan ring MUX 362, the input of the T_Scan register, is also controlled by TMS.

Bit 15 of the command register provides Master Clear/IZZ. This signal is ORed with the MC input pin if there is such a pin. This signal replaces the pin of the same name in ECD chips.

Bit 17 of the command register holds Test Initialize/IZV. This signal is used to initialize logic in test mode. An example is that of forcing a counter in the address path to generate an address sequence to write each location of a custom RAM block. This signal should clear the counter, enable it to count and force the count to the address inputs of the logic block (or blocks) being initialized. When the signal drops, a normal test can begin or whatever is indicated by the other control signals.

Another test signal is provided. Sometimes, in order to get sufficient test coverage, a signal is needed that forces logic a particular way or into a specific test at regular or pseudo-random intervals. The test controller provides such a signal, IZX, and its complement izx. These signals are enabled when both IZU and IZV are active and provide a signal that is true (a constant 1 level) for 16 clocks of every 64 clocks and a 0 level otherwise).

This is the expected truth table of the 3 test control signals:

| IZZ | IZU | IZV | Function |
|---|---|---|---|
| 0 | 0 | 0 | Normal logic operation |
| 1 | 0 | 0 | System Master Clear (Clear needed holding regs for normal operation) |
| X | 1 | X | Force logic into test mode (Clears things not cleared by IZZ) |
| X | X | 1 | Force test initialization |
| X | 1 | 1 | Enable repeating test sequence signal IZX |

This truth table is a minimum. The table can be extended as long as the extension does not contradict this table (which would require that different chips would have to be tested differently).

The IZZ and IZU signals stay active even when TMS (the master test control signal) is inactive. IZV and IZX are disabled when TMS is inactive. All the signals become active on the clock edge after TMS becomes active if the respective bits of the control register are 1s.

Figure 4:
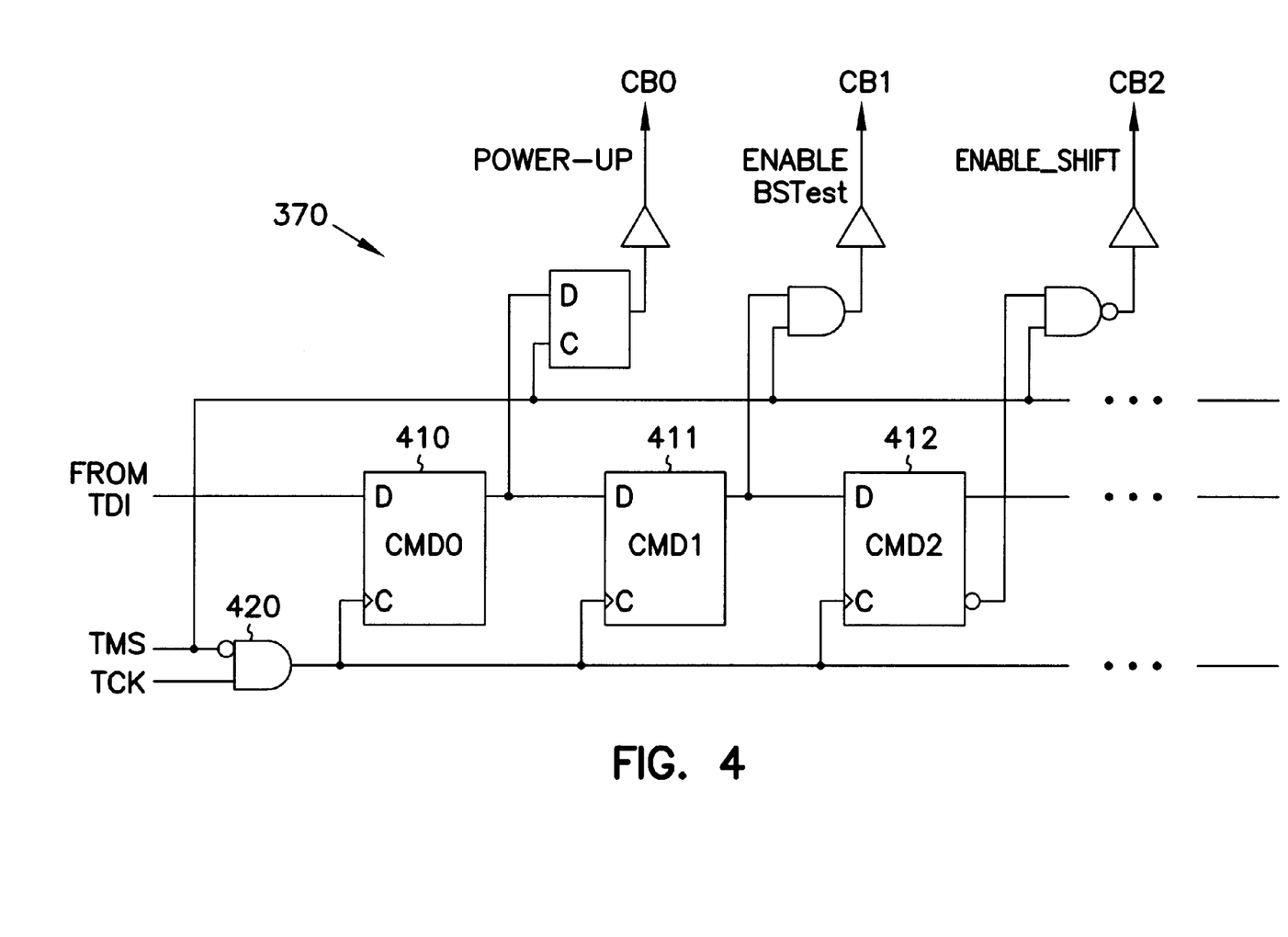
FIG. 4 is a schematic diagram of a portion of the logic of the controller used to control the test logic of this invention.

FIG. 4 is a schematic diagram of a portion of the logic of the command register 370 shown in FIG. 3. The logic shown is the logic for the first three bits of the command register 370. The logic for the rest of the command register 370 is very similar, so rather than show the logic for each and every bit of the command register 370 logic for several bits will be described in detail. A similar description would apply to the other bits. The bits that have similar logic are enumerated below rather than repeat a description for all of the 18 bits of the command register 370. The logic includes a series of edge-triggered flip-flops 410, 411 and 412. The flip-flops are initially loaded from the test data input (TDI) with the value of the command associated with every bit. Flip-flop 410 holds the command value for bit 0. Flip-flop 411 holds the command value for bit 1, and flip-flop 412 holds the command value for bit 2. The command register 370 also includes an AND gate to which the test strobe (TMS) and the test clock (TCK) are input. The AND gate 420 produces an output when in the presence of TCK and when TMS is not present. When TMS is not present and the test clock TCK is present, the command from TDI can be loaded into the various flip-flops 410, 411 and 412 to initialize or set the command up for running and to initialize the flip-flops in the proper states to execute the command. When TMS is present, the values from flip-flops 410, 411 and 412 are passed on as control outputs CB0 which control the power-up function of the test logic, CB1 which is bit 1 and enable the BS test (BST) which is output CB1 and ENABLE_SHIFT as the control CB2. The CB signals are routed around the part using standard chip routing. Most CB signals control logic associated with boundary scan (310, 320) and T_Scan (332, 342) functions. In some cases the CB terms are combined with chip clock or other control functions before being used by the test logic. This is below to provide more detail. The control register sends control signals (the CB terms) to the scan test logic. That logic, not the control register, serves to generate pseudorandom numbers [nothing digital can produce fully random anything; it only seems random to the function being exercised]. The logic at each stage Exclusive-ORs ("XORs") new data with the current contents of the register while shifting data along the path. This makes the data appear random, when in fact, it is fully deterministic.

The logic shown for CB0 is duplicated for CB bits 15 and 16. In other words, the logic associated with CB0 is the same as that logic associated with CB15 and CB16. The logic shown for CB1 is duplicated for bits 3–14 and bit 17. It should also be noted that the last bit of the command register, CB17, feeds the first bit of the boundary scan input register through MUX or multiplexer 380. As can be seen, the outputs 371, 372, 373 and 374 of the command register 370 which correspond to the CBXX signals discussed above, are used within the test logic to directly control the functions of the test logic. Both the boundary scan, the external boundary scan 350 and the internal scan 360 are directly controlled by the CBXX functions.

The Input Cell

As shown in FIG. 5, the input test logic 310 is comprised of a plurality of input cells 500. Input-cell test logic performs many functions including capturing boundary scan or other test operands coming in a chip's 230 input pins 300. This includes the capability to checksum input data as needed. The input cells 500 must also shift boundary-scan or other test results to the test-output port for observation, and must shift-in initial test operands for the BIST functions. At certain times, the input cells 500 generate test operands for test sequences. Some test functions could require that test operands be supplied from a chip's 230 input pins 300 rather than generated by this logic.

The needed functionality for one input pin 300 is implemented in the schematic shown in FIG. 5. Of course, there are numerous input cells 500 that form the input test logic 310. As can be seen, the input cell 500 is comprised of an input buffer 510 which buffers the data on the input pin 300. Each of the input cells has as inputs CB2 (enables shifting of data into all the boundary scan flip-flops) and CB3 which enables the input pin data to pass into the boundary scan flip-flops.

CB4 controls the loading of test data for BIST type self-testing. Since there are a number of input cells 500 associated with the input test logic 310, the CBn terms serve to fan out the command to the various input test cells 500. As shown in FIG. 5, the input test cell 500 includes a series of flip-flops 520, 522, 524 which are controlled by a first AND gate 530 and a second AND gate 540 which have their respective outputs input to an OR gate 550. When data is present and the CB3 control (enable input pin) is enabled, the flip-flops are loaded with data on the next clock. When the CB2 control (shift data to boundary scan flip-flops) is enabled in the presence of a Shift-In signal, AND gate 530 sends an input to OR gate 520.

Input cell 500 includes a MUX 560 controlled by CB4 (the control for BIST type testing). In the presence of CB4, the data at pin 300 and in the input buffer 510 is shifted into the core or main logic.

Shifting out is controlled automatically by the clock/control signal (CC1) and CB2. If CB2 is active when CC1 transitions to a logic one, data is shifted one place down the boundary scan chain.

CC1 is a gated clock signal; it has an equation of:

$$CC1 = CLK*CB5*TMS + TCK*\overline{TMS} + CB1*TCK*TMS.$$

CB5 is from bit 5 of the control register. TMS and TCK are the main test control signals. If the clock is not gated, the latch input equation must be expanded to include this functionality. (Implementation of the functionality using a gated clock is strongly suggested. This simplifies things by reducing the total fanouts and control signals. This should be done for all the CCn signals.) The sequence of latches (520, 522, 524) is shown assuming a latch based design system with a two phase clock.

As shown (with the 'true' side of 'clock' driving the master latch), this arrangement is used when receiving phase 0 data at the input latch. If a phase 1 signal is being received, the clock connections to the latches are reversed (complement going to the master, true to the slave).

If the next bit of the input register has the same clock phase as this bit, the Shift Out signal comes from the second latch, if, instead, the next bit has the opposite clock phase, Shift Out comes from the last latch.

When a test is active (TMS=1), the first bit of the register which is normally driven from the last bit of the control register, is connected to the last bit of the output register so that test results are kept on-chip and test operands generated in the major BIST modes are more random. This is done with a MUX under control of TMS (as shown in FIG. 3).

Output Test Pin Logic

FIG. 6 shows the logic associated with an output test cell 600 of the output test logic 320. It should be noted that the logic used is the same or similar to the logic associated with the input test cell 500. This is by design since the input pins may become outputs or vice versa. A series of flip-flops 620, 622 and 624 are controlled by a pair of AND gates 630 and 640. The inputs to the AND gates include CB2 and CB6 which control the outputting of data from flip-flops for an external boundary scan.

MUX 660 has as an input CB7 which controls the output of data from main logic after a BIST self-test. Shifting out is controlled by CB2 in conjunction with the clocking term CC2, as for the input cell, FIG. 5.

The CC2 logic equation is:

$$CC2=CLK*CB8*TMS+TCK*\overline{TMS}+CB1*TCK*TMS.$$

As shown (with the 'true' side of 'clock' driving the master latch), this arrangement is used when receiving phase 0 data at the input latch. If a phase 1 signal is being received, the clock connections to the latches are reversed (complement going to the master, true to the slave).

The Shift Output signal connection is dependent on the phase of the next position in the shift register.

The shift input of the first bit of the output register is driven from the last bit of the input register. The last bit of the output register drives a MUX that, in turn is connected to TDO. See FIG. 3.

Internal Test Logic

Test logic can be added within each internal logic module on chip. This logic allows data to be observed coming into the module and allows test data to be forced from the output latches of the module. In addition, logic nodes within the module can be observed and controlled from the added test logic. The effect of this is that a module is tested with operands generated in the modules that drive its inputs and the results of the test sequence observed and checksummed in the modules that receive its outputs in addition to any state that is captured by the added test logic within the module.

Test logic can also be added to the external connections of internal logic modules. This added test logic is used to test custom or embedded logic blocks, since there is no test access within the custom logic.

When using a first self-test method such as BIST, the internal test logic can also be powered down under control of a bit in the test control register.

The test logic within a module has two components: 1) the T_Scan register (added as necessary) and 2) changes to the output latch functions of the module, if necessary.

Figure 7:
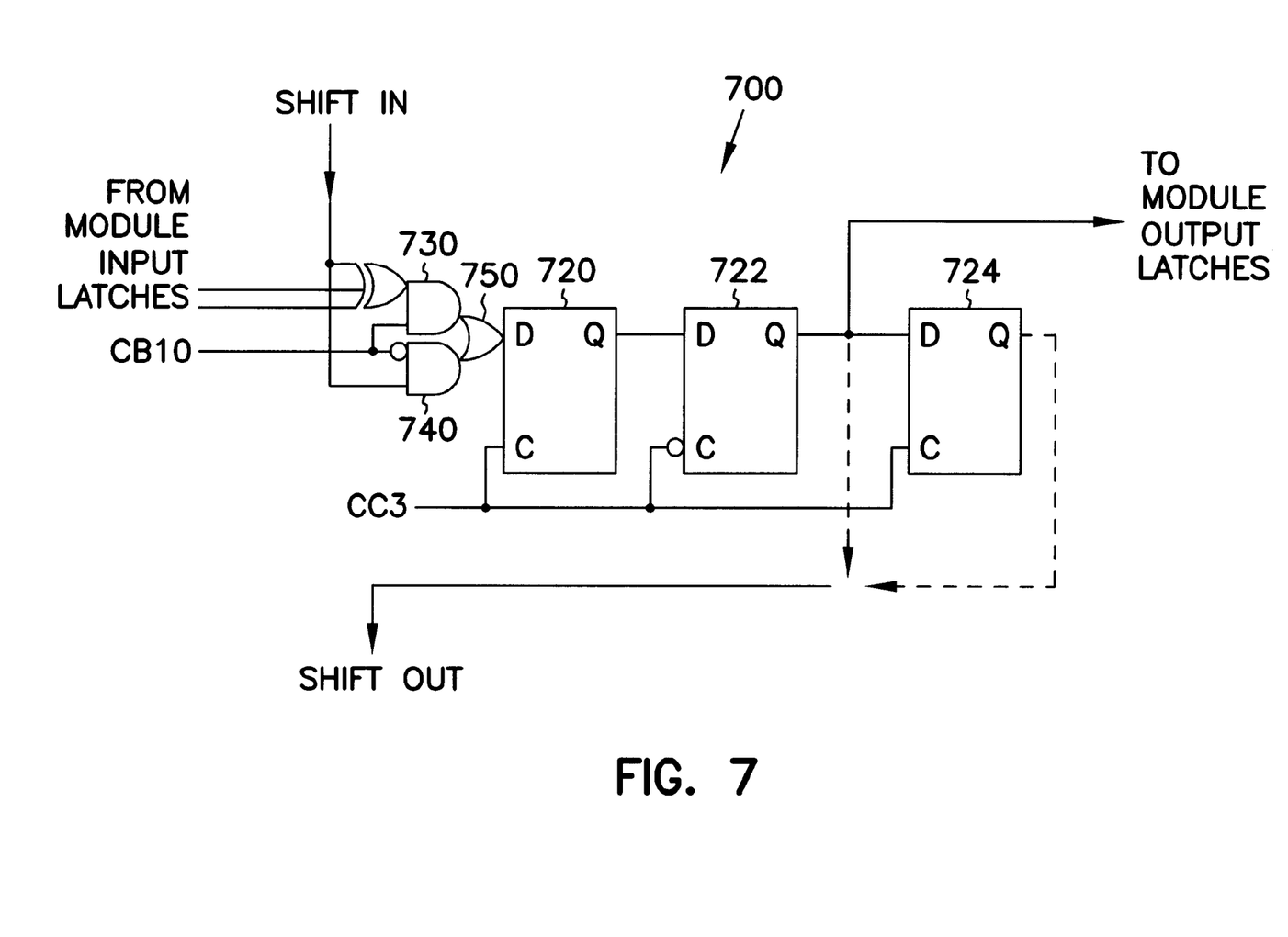
FIG. 7 is a schematic diagram showing the test cell for bidirectional pin.

FIG. 7 shows a T_Scan register or added logic bit for an internal scan ring. It is a slight variation on the input cell 500 and output cell 600.

The added test logic cell 700 includes a series of flip-flops 720, 722, and 724 controlled by a pair of AND gates 730 and 740 and an OR gate 750. Control input CB10 controls the inputs to the test cell 700.

The CC3 clock equation is:

$$CC3=CLK*CB11*TMS+TCK*TMS.$$

Again, the clock connections to the latches are reversed if phase 1 data is input and output instead of phase 0 data. The 'dashed' latch is used if the next bit in the shift chain is of the opposite clock phase as the current bit.

Other versions of the logic function shown above are possible. The logic shown has the major feature of check-summing two input bits into one position of the T_Scan register. If, for example, the register is being used to generate controllability functions simpler logic can be designed and used.

Normally, the shift-in path of the first bit of the register is from the TDI pin. When the part is in test mode, the last bit of the register drives the first bit so that all test results are kept in the register.

Of course, the signals in the figure shown as coming from the input pin must be inverted so that an open pin doesn't force a constant Master Clear into a chip at wafer probe or in a test fixture. module's input latches can also come from internal logic nodes if necessary for increasing observability within a module. Similarly, signals from the latches can be used for controllability functions.

Advantageously, the invention includes a method and apparatus for determining if a logic module may have a portion that is untestable and a method and apparatus for testing the untestable portions. The invention also provides a method and apparatus that can be used by the logic designer or logician to add logic during the design phase to sensitize paths to untestable areas. The invention provides a flexible self-testing method and apparatus that is adaptable and can be used to sensitize certain paths on an integrated circuit so that faults that might otherwise go unnoticed are output to the output pins. The command register of the invention also provides for flexible control of the test as well as flexibility in the types of test to be executed. An additional advantage of the testing method is that it can also could do boundary scan type testing, much like the JTAG standard, found at IEEE/ANSI 1149.1-1990. The command register can also power down the logic used for testing the integrated circuit when the integrated circuit is not under test. This saves power and reduces the overall cooling load on the computer.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A self-testing procedure for a logic part having a first portion of core logic testable using a first self-testing procedure and having a second portion of core logic testable using a second self-testing procedure and not testable using the first self-testing procedure, said procedure comprising the steps of:

initializing the first portion of core logic part with a first test value;

initializing the second portion of core logic part with a first test value;

executing the test using the first self-testing procedure on the first portion and using the second self-testing procedure on the second portion;

summing the test results from the first portion of core logic and the second portion of core logic such that test results are kept in the chip logic and become new test operands in succeeding clocks; and checking the output of the summer to determine whether the logic part is good.

2. The self-testing procedure of claim 1 further comprising the step of generating a new operand for the next test.

3. The self-testing procedure of claim 2 wherein the step of generating a new operand for the next test is done periodically.

4. The self-testing procedure of claim 3 wherein the period between tests is related to the clock cycle of the logic part.

5. The self-testing procedure of claim 2 wherein the step of generating a new operand for the next test comprises generating a random number as the operand.

6. The self-testing procedure of claim 1 further comprising the step of determining the length of the test based on the cooling environment of the logic part.

7. The self-testing procedure of claim 1 further comprising the step of substantially reducing power to the test logic when the testing logic is not being used.

8. The self-testing procedure of claim 1 further comprising saving power in the logic part that includes testing logic, the method comprising the steps of:

determining if the logic part is under test; and substantially powering down the testing logic on the logic part when the logic part is not under test.

9. The self-testing procedure of claim 8 wherein the step of determining if the logic part is under test is determined by reading a register bit in a command register.

10. The self-testing procedure of claim 1 wherein the testing logic further comprises:

a first type of built-in testing logic for testing a first number of the logic modules of the first portion of core logic;

a second type of built-in test logic for testing a second number of logic blocks of the second portion of core logic, said second number of logic blocks connected to the second type of built-in scan logic being untestable using the first type of built-in logic;

a test data input for inputting test data to the second type of testing logic and to a plurality of input pins of the first portion of core logic; and a test data output for outputting test data from the second type of testing logic and from the first portion of core logic.

11. The self-testing procedure of claim 10 wherein the second type of built-in scan logic includes an internal scan ring.

12. The self-testing procedure of claim 11 wherein the testing logic further comprises a command register for receiving commands and outputting control signals to control the first and second portions of core logic and the testing logic.

13. The self-testing procedure of claim 12 wherein the command register outputs control signals including control signals for generation of data, and shifting of data.

14. The self-testing procedure of claim 12 wherein the command register has a plurality of registers, the plurality of registers loaded with different values to execute a different commands.

15. The self-testing procedure of claim 12 further comprising issuing a command from the command register to substantially reduce the power to the testing logic in response to a value of one of the registers of the command register.

16. The self-testing procedure of claim 15 further comprising the step of indicating that the logic part is not in test mode based on the value of one of the registers of the command register.

17. The self-testing procedure of claim 11 wherein the command register associated with the testing logic controls the internal scan ring.

18. The self-testing procedure of claim 11 further comprises inputting test data to the input pins of the first portion of core logic and to the internal scan ring.

19. The self-testing procedure of claim 11 further comprising multiplexing data output form the first portion of core logic and data from the internal scan ring to produce test data output.

20. The self-testing procedure of claim 11 further comprising providing an external scan ring for testing the wiring of a first module with respect to a second module.

21. The self-testing procedure of claim 11 wherein the logic part further comprises a plurality of logic modules, each logic module having at least one logic block associated with each logic module, said internal scan ring attached to the logic modules which, when tested using the first type of built-in self-testing logic the results were not observable at an output pin.

22. The self-testing procedure of claim 1 further comprising the steps of:

performing a first self-test on a first portion of core logic on a module; and performing a second self-test on a second portion of core logic on a module, wherein faults in the said second portion of the core logic will not be output from the second portion of the core logic when the first self-test is applied to the second portion of the core logic.

23. The self-testing procedure of claim 22 wherein the step of performing a first self-test on a first portion of core logic and the step of performing a second self-test on a second portion of core logic on a module are performed substantially simultaneously.

24. The self-testing procedure of claim 22 further comprising the step of testing the electrical connections between the modules.

25. The self-testing procedure of claim 22 further comprising the step of combining the output of the first self-test on the first portion of core logic on a module and the output of the second self-test on the second portion of core logic on a module.

26. The self-testing procedure of claim 22 further comprising the step of adding test logic to the second portion of core logic on a module to make at least a portion of the second portion of core logic testable using the first self-test.

27. The self-testing procedure of claim 22 further comprising the step of adding an internal scan chain to the second portion of core logic on a module.

28. The self-testing procedure of claim 27 further comprising the step of adding control to the internal scan chain of the second portion of core logic.

29. The self-testing procedure of claim 1 further comprising the steps of:

determining if one of the first portion of core logic and second portion of core logic would not show a fault using the first type of self-testing procedure; and adding an internal scan ring for testing the one of the first portion of core logic and second portion of core logic would not show a fault using the first type of self-testing procedure.

30. The self-testing procedure of claim 29 further comprising the step of controlling the internal scan ring with a command register capable of executing a plurality of commands.

31. The self-testing procedure of claim 29 further comprising the step of determining when the logic part is not being tested and powering down logic related to self-testing the main logic of the logic part.

32. The self-testing procedure of claim 29 wherein the step of adding an internal scan ring includes linking the scan ring to a logic module.

33. An integrated circuit apparatus comprising:

main logic for performing digital logic operations, said main logic farther comprised of a plurality of logic modules, each of the logic modules having at least one logic block associated therewith, said main logic further comprising:
- a first portion of main logic having a first number of logic blocks;
- a second portion of main logic having a second number of logic blocks;
- a plurality of input pins for receiving data; and
- a plurality of output pins for outputting data from the main logic; and testing logic for performing dynamic tests of the main logic, said testing logic further comprising:
- a first type of built-in testing logic for testing the first number of the logic modules of the main logic; and
- a second type of built-in test logic for testing the second number of logic blocks, said second number of logic blocks connected to the second type of built-in scan logic being untestable using the first type of built-in logic, wherein the integrated circuit apparatus undergoes a self-testing procedure comprising:
  - initializing the first portion of main logic part with a first test value;
  - initializing the second portion of main logic part with a first test value;
  - executing the test using a first self-testing procedure on the first portion and using a second self-testing procedure on the second portion;
  - summing the test results from the first portion of main logic and the second portion of main logic such that test results are kept in logic associated with the integrated circuit and becomes new test operands in succeeding clocks; and
  - checking the summed output to determine whether the main logic part is good.

34. A logic part comprising:

a first portion of core logic testable using a first self-testing procedure;

a second portion of core logic testable using a self-testing procedure and not testable using the first self-testing procedure;

a testing logic portion;

a third portion for initializing the first portion of core logic part with a first test value;

a fourth portion for initializing the second portion of core logic part with a first test value, the logic part executing the test using the first self-testing procedure on the first portion and using the second self-testing procedure on the second portion;

a summer for summing the test results from the first portion of core logic and the second portion of core logic such that test results are kept in the chip logic and become new test operands in succeeding clocks; and a comparator for checking the output of the summer to determine whether the logic part is good.

* * * * *

UNITED STATES PATENT AND TRADEMARK OFFICE
CERTIFICATE OF CORRECTION

PATENT NO.    : 6,349,398 B1
DATED         : February 19, 2002
INVENTOR(S)   : Resnick It is certified that error appears in the above-identified patent and that said Letters Patent is hereby corrected as shown below:

<u>Column 2,</u>
Line 19, delete "fall" and insert -- full --, therefor.

<u>Column 13,</u>
Line 61, after "execute" delete "a".

<u>Column 16,</u>
Line 14, delete "a self-testing" insert -- a second self-testing --.

Signed and Sealed this

Twenty-third Day of July, 2002

*Attest:*

JAMES E. ROGAN
*Attesting Officer*    *Director of the United States Patent and Trademark Office*